(12) United States Patent
Mahmud et al.

(10) Patent No.: US 9,349,698 B2
(45) Date of Patent: May 24, 2016

(54) INTEGRATED WLUF AND SOD PROCESS

(75) Inventors: Rubayat Mahmud, Chandler, AZ (US); Saikumar Jayaraman, Chandler, AZ (US); Sriram Muthukumar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/534,565

(22) Filed: Jun. 27, 2012

(65) Prior Publication Data

US 2014/0001631 A1    Jan. 2, 2014

(51) Int. Cl.
*H01L 23/48* (2006.01)
*H01L 23/00* (2006.01)
*H01L 23/31* (2006.01)

(52) U.S. Cl.
CPC ............ *H01L 24/11* (2013.01); *H01L 23/3157* (2013.01); *H01L 24/03* (2013.01); *H01L 24/05* (2013.01); *H01L 24/14* (2013.01); *H01L 24/13* (2013.01); *H01L 2224/02126* (2013.01); *H01L 2224/0384* (2013.01); *H01L 2224/0391* (2013.01); *H01L 2224/03845* (2013.01); *H01L 2224/0401* (2013.01); *H01L 2224/05567* (2013.01); *H01L 2224/05571* (2013.01); *H01L 2224/05647* (2013.01); *H01L 2224/1132* (2013.01); *H01L 2224/1147* (2013.01); *H01L 2224/1148* (2013.01); *H01L 2224/11474* (2013.01); *H01L 2224/11849* (2013.01); *H01L 2924/00014* (2013.01)

(58) Field of Classification Search
CPC ...................................... H01L 24/11
USPC ............................ 438/612, 613; 257/612, 613
See application file for complete search history.

(56) References Cited

U.S. PATENT DOCUMENTS

| | | | |
|---|---|---|---|
| 5,926,731 A * | 7/1999 | Coapman et al. | 438/613 |
| 2001/0003656 A1* | 6/2001 | Funaya et al. | 438/1 |
| 2004/0113283 A1* | 6/2004 | Farnworth et al. | 257/782 |
| 2004/0188123 A1* | 9/2004 | Peterson | H01L 23/296 174/523 |
| 2004/0232562 A1* | 11/2004 | Hortaleza et al. | 257/778 |
| 2006/0087034 A1* | 4/2006 | Huang et al. | 257/737 |

OTHER PUBLICATIONS

Doki, Katsuji, "Advances in thick photoresists for flip-chip bumping", (Aug. 1, 2005), 5 pgs.

* cited by examiner

*Primary Examiner* — William Harriston
(74) *Attorney, Agent, or Firm* — Schwegman Lundberg & Woessner, P.A.

(57) ABSTRACT

This disclosure relates generally to a wafer having a plurality of semiconductor chips having a major surface, a metal contact positioned on one of the plurality of semiconductor chips and having a side surface and contact surface, the contact surface substantially parallel to the major surface, wherein the contact surface defines a thickness of the metal contact relative to the major surface, an underfill layer abutting the one of the plurality of semiconductor chips and the side surface of the metal contact, the underfill layer having a top surface substantially parallel to the major surface, wherein the top surface of the underfill layer defines a thickness of the underfill layer relative to the major surface, the thickness of the underfill layer being not greater than the thickness of the metal contact, and a solder bump formed in electrical contact with the contact surface of the metal contact.

11 Claims, 7 Drawing Sheets

INTEGRATED WLUF AND SOD PROCESS

TECHNICAL FIELD

The disclosure herein relates generally to electrical interconnects and methods for making electrical interconnects on a semiconductor chip.

BACKGROUND ART

Semiconductor fabrications have long utilized electrical interconnects with solder microbonding. Simplistically, a copper bump may be formed on a wafer, a sacrificial layer is applied on top of the copper bump and a cavity formed, solder is reflowed into the cavity, and the layer is stripped off of the wafer. The result of the process is a solder bump which may be replicated on various locations on the wafer. However, current methodologies may produce inconsistencies in the resultant solder bumps. Improved solder bump configurations are desired.

DESCRIPTION OF THE EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
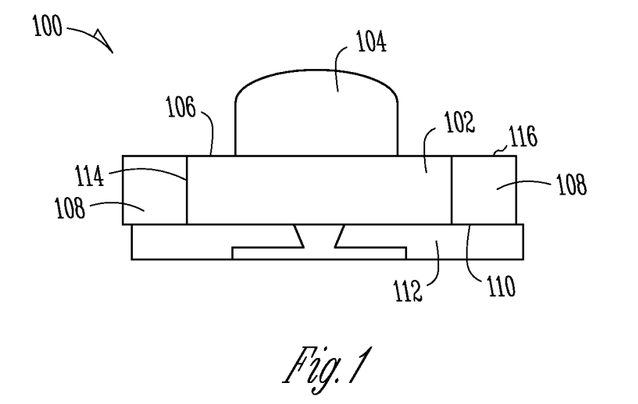
FIG. 1 is an electrical interconnect in accordance with some embodiments.

FIG. 1 is a side profile of an electrical interconnect 100. The electrical interconnect 100 includes a metal contact 102, a solder bump or second metal contact 104 on a contact surface 106 of, and in electrical contact with the metal contact 102, and an underfill layer 108 surrounding the metal contact 102. The metal contact 102 can be made of copper. The underfill layer 108 abuts a major surface 110 of a semiconductor chip 112 and a side surface 114 of the metal contact 102.

As illustrated, the contact surface 106 of the metal contact 102 is substantially parallel to the major surface 110 of the chip 112. The orthogonal distance between the contact surface 106 and the major surface 110 of the chip 112 can define the thickness of the metal contact 102. As illustrated, a top surface 116 of the underfill layer 108 is substantially parallel to the major surface 110 of the chip 112 and substantially flush with the contact surface 106. The orthogonal distance between the top surface 116 of the underfill layer 108 and the major surface 110 of the chip can define the thickness of the underfill layer 108.

As illustrated, thickness of the underfill layer 108 is approximately equal to the thickness of the metal contact 102. In an example, the metal contact 102 and the underfill layer 108 are each approximately 18.5 micrometers thick with a tolerance of approximately four (4) micrometers. In such an example, the solder bump 104 can be approximately twenty-five (25) micrometers thick from the contact surface 106 of the metal contact 102, with a tolerance of approximately two (2) micrometers. The thickness of the underfill layer 108 can be less than the thickness of the metal contact 102. In various examples consistent with the electrical interconnect 100, the thickness of the underfill layer 108 being not greater than the thickness of the metal contact 102 can be achieved according to the process flow shown at least with respect to FIG. 2, below.

The underfill layer 108 may function as a support or collar for the electrical interconnect 100 generally and the metal contact 102 and, by extension, the solder bump 104 specifically. The underfill layer 108 can have an "Alpha-1" coefficient of thermal expansion of less than $30*10^{-6}$ per degree Celsius below a glass transition temperature ($T_g$) of the underfull layer 108. The underfill layer 108 can have an "Alpha-2" coefficient of thermal expansion of less than $120*10^{-6}$ per degree Celsius above the $T_g$ of the underfill layer 108. The underfill layer 108 can have a glass transition temperature (Tg) of greater than one hundred ten (110) degrees Celsius and a flexural modulus of four (4) gigaPascals at one hundred (100) degrees Celsius. The underfill layer 108 can have a maximum moisture absorption of two (2) percent, and may be selected for its adhesion to silicon, copper, tin-silver alloy, tin-silver-copper alloy, tin-lead alloy, solder resist, and silicon nitride. The underfill layer 108 may further be selected to be resilient during preconditioning for solder reflowing and five solder reflows, as well as at least seven hundred fifty (750) temperature cycles from negative fifty-five (−55) degrees Celsius to one hundred twenty-five (125) degrees Celsius. In various examples, the underfill layer 108 is any of a variety of materials known in the art to meet the above standards.

The electrical contact 100 may reduce inter-level dielectric stress on the chip by thirty (30) percent or more relative to conventional processes, such as may produce a fourteen (14) nanometer node. The electrical interconnect 100 may also be utilized in a line-to-line architecture, a fine-pitch copper bump process, and three-dimensional stacking with a true silicon via.

FIGS. 2a-2h illustrate a sequential process flow for making the electrical interconnect 100.

Figure 2A:
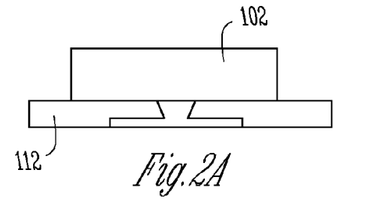
FIGS. 2a-2h are a process flow for making the electrical interconnect in accordance with some embodiments.

In FIG. 2a, the metal contact 102, such as a copper metal contact, is formed or otherwise provided on the chip 112.

Figure 2B:
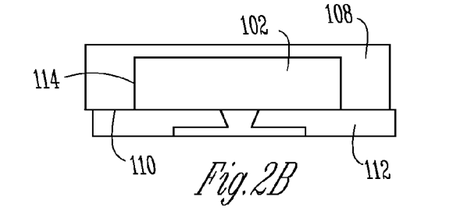

In FIG. 2b, the underfill layer 108 is applied, covering the metal contact 102 and abutting the side surface 114 of the metal contact 102 as well as the major surface 110 of the chip 112. The underfill layer 108 may be applied according to various processes known in the art, including via a lamination process, spin coating and slit coating processes.

Figure 2C:
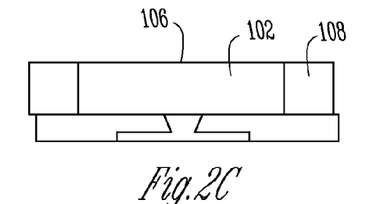

In FIG. 2c, the contact surface 106 of the metal contact 102 is exposed through planarization of the electrical interconnect 100, specifically, and the rest of the chip 112, generally. All of the contact surface 106 of the metal contact 102 can be exposed. Planarization may remove a portion of the underfill layer 108 so that the thickness of the underfill layer 108 is not greater than the thickness of the metal contact 102. The metal contact 102 may be planarized through grinding, polishing, chemical mechanical polishing (CMP), or through other methods known in the art.

Figure 2D:
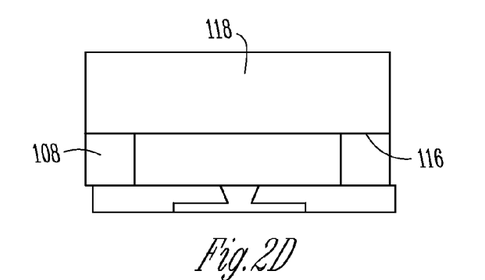

In FIG. 2d, a photoresist layer 118 is applied to the top surface 116 of the underfill layer 108. The photoresist layer 118 can be made from a dry film resist and/or photoresist material known in the art. The photoresist layer 118 can be applied according to various processes known in the art, including but not limited to the process utilized to apply the underfill layer 108.

Figure 2E:
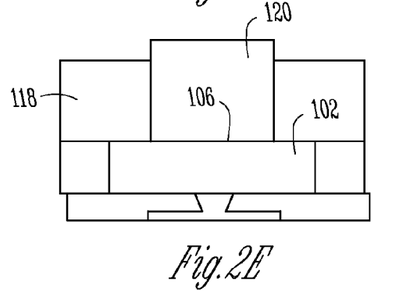

In FIG. 2e, the contact surface 106 of the metal contact 102 is exposed by forming an opening 120 in the photoresist layer 118. The opening 120 may be formed according to processes known in the art. The opening can be descumed and/or deoxygenated according to processes that will be understood to one of ordinary skill in the art, having the benefit of the present disclosure.

Figure 2F:
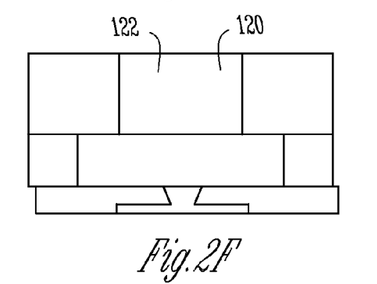

In FIG. 2f, a paste 122 can be printed in the opening 120, according to processes that will be understood to one of ordinary skill in the art, having the benefit of the present disclosure.

Figure 2G:
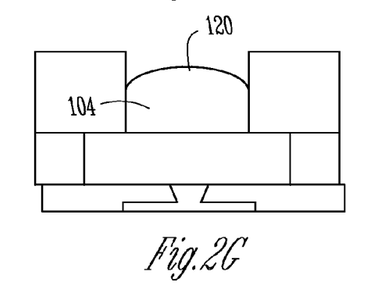

In FIG. 2g, the solder bump 104 can be reflowed into the opening 120 according to processes that will be understood to one of ordinary skill in the art, having the benefit of the present disclosure.

Figure 2H:
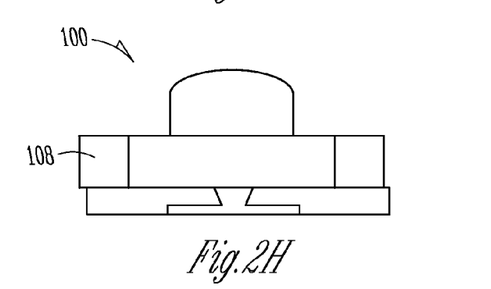

In FIG. 2h, the photoresist layer 118 is stripped, upon which the electrical interconnect 100 can be cleaned and can be baked to cure the underfill layer 108.

Figure 3A:
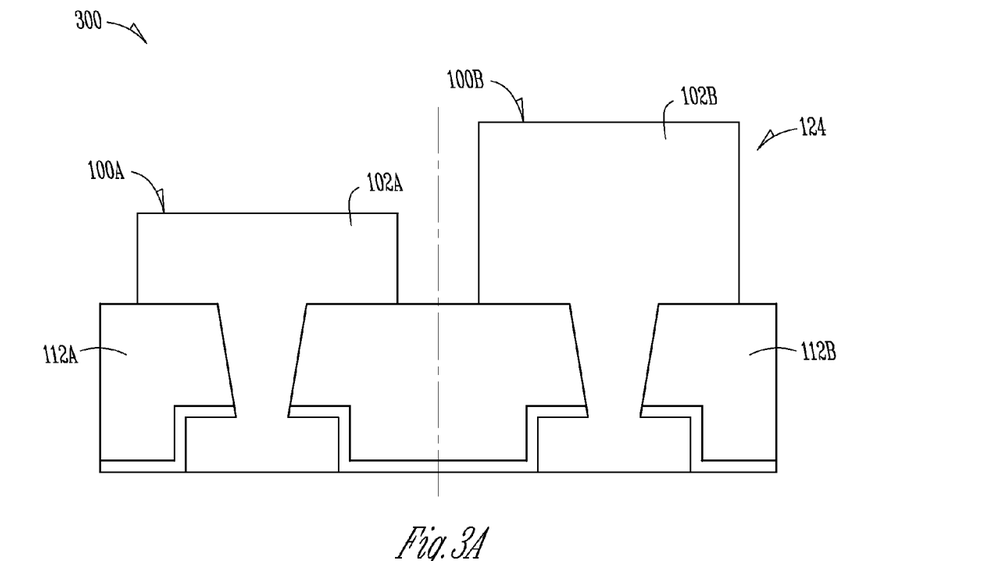
FIGS. 3a-3c are a portion of a process flow for making multiple electrical interconnects in accordance with some embodiments.
Figure 3B:
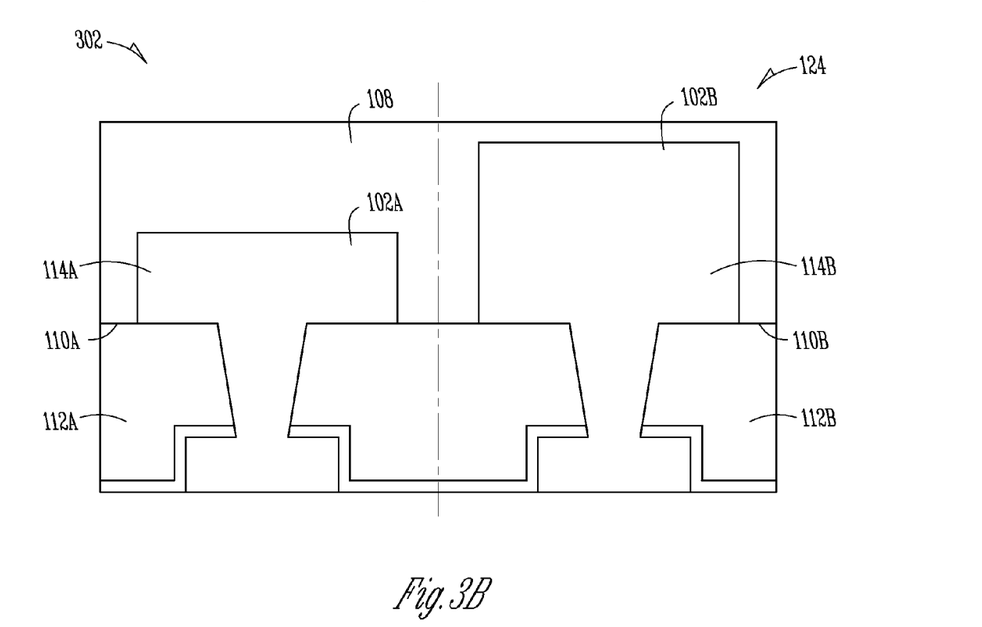
Figure 3C:
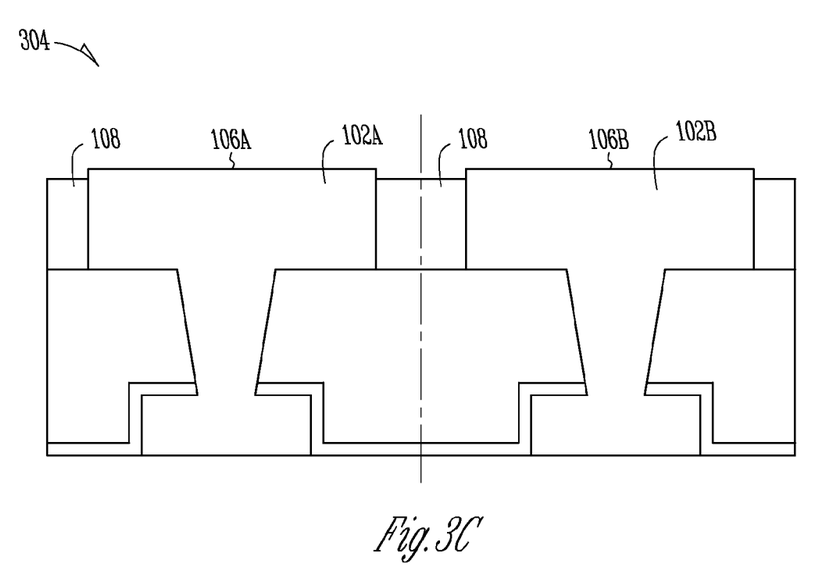

FIGS. 3a-3c illustrate a detailed image of a sequential portion of a process flow for making multiple electrical interconnects 100a, 100b on a plurality of chips 112a, 112b of a wafer 124. It is emphasized that FIG. 3 is stylized and simplified, and that the wafer 124 may incorporate multiple chips 112 each of which incorporate multiple electrical interconnects 100.

In FIG. 3a, the metal contacts 102a, 102b, such as a copper metal contacts, are formed or otherwise provided on each chip 112a, 112b. It is noted in this stylized rendering that the metal contacts 102a, 102b are mismatched, whether deliberately or owing to process inconsistencies.

In FIG. 3b, the underfill layer 108 is applied over the wafer 124, covering the metal contacts 102a,102b and abutting the side surface 114 of the metal contacts 102a, 102b as well as the major surfaces 110a, 110b of the chips 112a, 112b. The underfill layer 108 may be applied according to various processes known in the art, including lam, spin and slit processes.

In FIG. 3c, the contact surfaces 106a, 106b of the metal contacts 102a, 102b are exposed through planarization. The planarization process makes the metal contacts 102a, 102b be approximately coplanar. In an example, all of the electrical interconnects 100 on the wafer 124 have a coplanarity of not greater than about five (5) micrometers. In an example, all of the electrical interconnects 100 of the wafer 124 have a coplanarity of between about three (3) and about five (5) micrometers.

All of the contact surfaces 106a, 106b of the metal contacts 102a, 102b can be exposed. Planarization may remove a portion of the underfill layer 108 so that the thickness of the underfill layer 108 is not greater than the thickness of the metal contacts 102a, 102b. The electrical interconnects 100a, 100b may be planarized through grinding, polishing, or both, or through other methods known in the art.

FIGS. 4a-4g illustrate a sequential process flow for making an electrical interconnect 150. In contrast to the electrical interconnect 100, the electrical interconnect 150 is not formed utilizing planarization following the application of an underfill layer 158. Consequently, the electrical interconnects 150 may have less coplanarity than the electrical interconnects 100. In various examples, the electrical interconnects 150 may have a coplanarity from five (5) to thirteen (13) micrometers. In an example, the electrical interconnects 150 have a coplanarity of approximately five (5) micrometers.

Figure 4A:
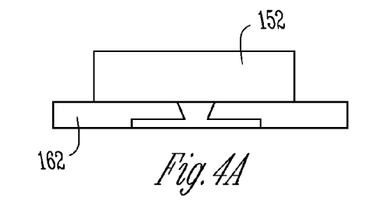
FIGS. 4a-4g are a process flow for making an alternative electrical interconnect in accordance with some embodiments.

In FIG. 4a, a metal contact 152, such as a copper metal contact, is formed or otherwise provided on a chip 162.

Figure 4B:
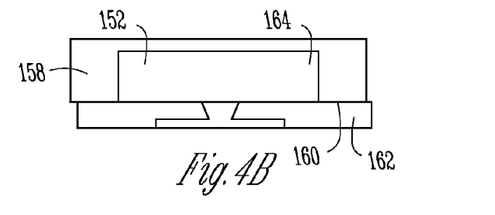

In FIG. 4b, the underfill layer 158 is applied, covering the metal contact 152 and abutting a side surface 164 of the metal contact 152 as well as a major surface 160 of the chip 162. The underfill layer 158 may be applied according to various processes known in the art, including via a lamination process, spin coating and slit coating processes.

Figure 4C:
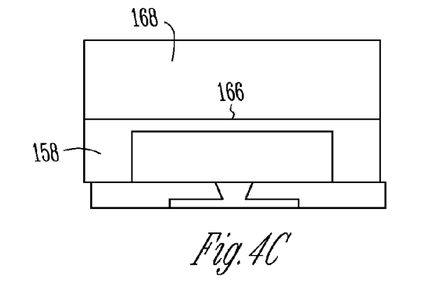

In FIG. 4c, a photoresist layer 168 is applied to the top surface 166 of the underfill layer 158. The photoresist layer 168 can be made from a dry film resist and/or photoresist material known in the art that is photo-definable with respect to the underfill layer 158 at the same environmental condition. The photoresist layer 168 can be applied according to various processes known in the art, including but not limited to the process utilized to apply the underfill layer 158.

Figure 4D:
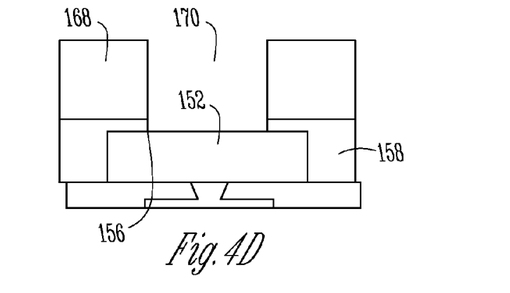

In FIG. 4d, the contact surface 156 of the metal contact 152 is exposed by forming an opening 170 in the underfill layer 158 and the photoresist layer 168. The opening 170 may be formed according to processes known in the art. The opening can be descumed and/or deoxygenated according to processes known in the art.

Figure 4E:
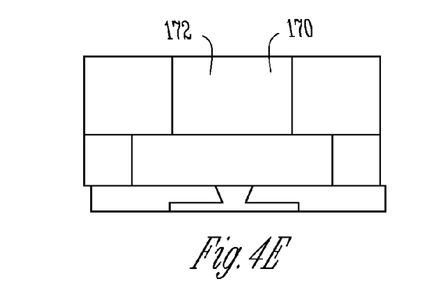

In FIG. 4e, a paste 172 or other solder can be printed in the opening 170.

Figure 4F:
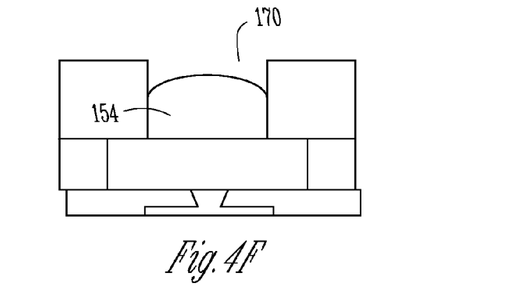

In FIG. 4f, a solder bump 154 can be reflowed into the opening 170 according to processes that will be understood to one of ordinary skill in the art, having the benefit of the present disclosure.

Figure 4G:
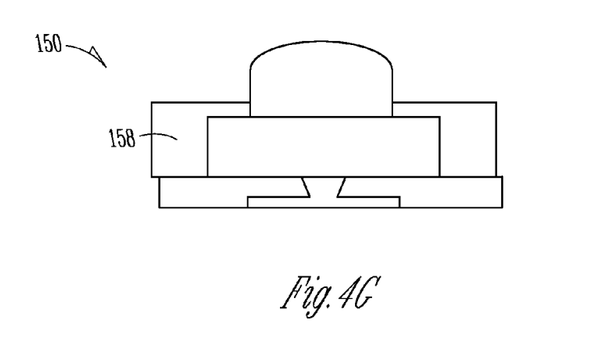

In FIG. 4g, the photoresist layer 168 is stripped, upon which the electrical interconnect 150 can be cleaned and can be baked to cure the underfill layer 158.

The process flow of FIGS. 4a-4g may beneficially reduce a number of process flows or total steps over alternative processes for making an electrical interconnect. Rather than utilizing two or more process flows, the electrical interconnect 150 may be formed from a single process flow, as shown above. As a result, the process flow for making the electrical interconnect 150 may save time and money in development in comparison to an electrical interconnect which utilizes two process flows. In addition, the process flow of FIGS. 4a-4g may produce electrical interconnects 150 with greater coplanarity than other electrical interconnects made according to other methods. However, owing to the lack of planarization, the process flow of FIGS. 4a-4g may produce electrical interconnects 150 with less coplanarity than the process flow of FIGS. 2a-2h which produces electrical interconnects 100.

Figure 5:
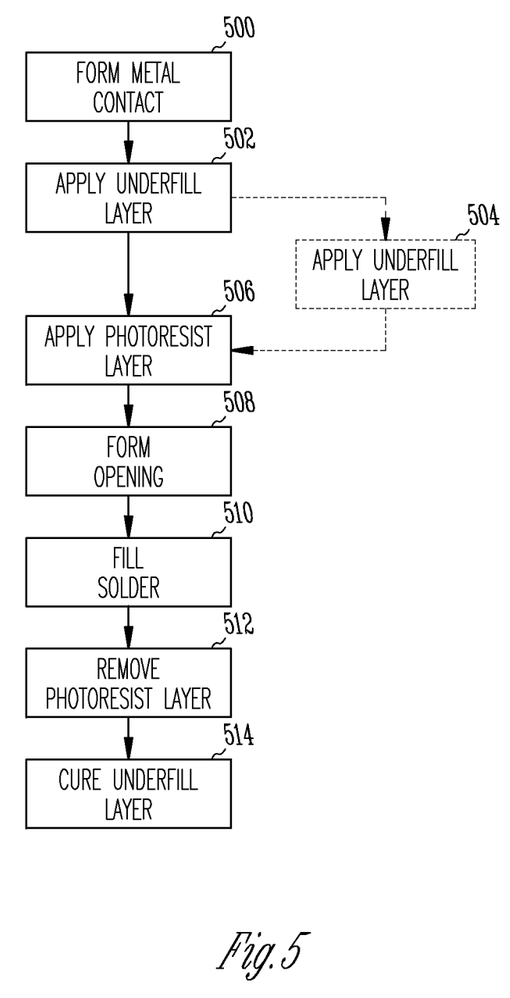
FIG. 5 is a flow chart for making an electrical interconnect in accordance with some embodiments.

FIG. 5 is a flowchart for producing an electrical interconnect such as electrical interconnect 100 or electrical interconnect 150.

At 500, a metal contact 102, 152 is formed on a substrate, such as a substrate of the semiconductor chip 112, 162, so that the contact surface 106, 156 of the metal contact 102, 152 is substantially parallel to the semiconductor chip 112, 162.

At 502, an underfill layer 108, 158 is applied to the semiconductor chip 112, 162 and the side surface 114, 164 of the metal contact 102, 152.

At 504, the underfill layer 108 is optionally planarized to ultimately produce electrical interconnect 100. Electrical interconnect 150 may not have underfill layer 158 planarized.

At 506, the photoresist layer 118, 168 is applied to the top surface 116, 166 of the underfill layer 108, 158.

At 508, the opening 120, 170 is formed in the photoresist layer 118, 168 and, in the case of electrical interconnect 150, in the underfill layer 158.

At 510, the solder bump 104, 154 is filled or reflowed in the opening 120, 170.

At 512, the photoresist layer 118, 168 is removed, leaving no or substantially no residue.

At 514, underfill layer 108, 158 is cured by applying ambient heat.

Figure 6:
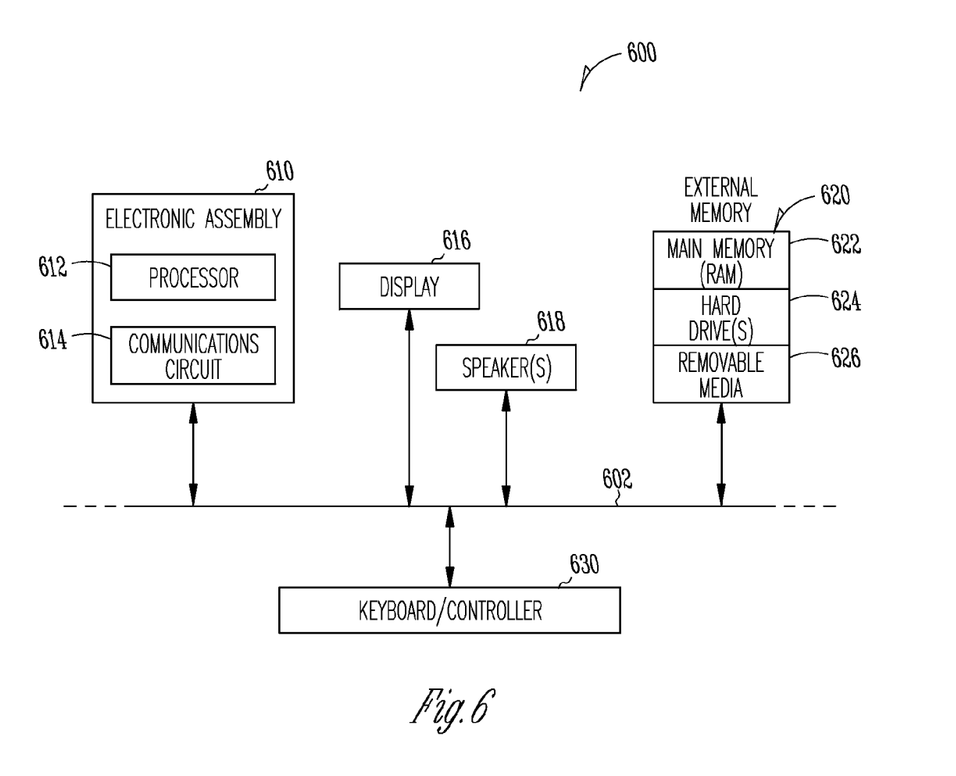
FIG. 6 is a block diagram of an electronic device incorporating at least one chip with at least one electrical interconnect in accordance with some embodiments.

An example of an electronic device using semiconductor chips and elongated structures as described in the present disclosure is included to show an example of a higher level device application for the present invention. FIG. 6 is a block diagram of an electronic device 600 incorporating at least one chip 112 with at least one electrical interconnect 112. The electronic device 600 is merely one example of an electronic system in which embodiments of the present invention can be used. Examples of electronic devices 600 include, but are not limited to personal computers, tablet computers, mobile telephones, personal data assistants, MP3 or other digital music players, etc. In this example, the electronic device 600 comprises a data processing system that includes a system bus 602 to couple the various components of the system. The system bus 602 provides communications links among the various components of the electronic device 600 and can be implemented as a single bus, as a combination of busses, or in any other suitable manner.

An electronic assembly 610 is coupled to the system bus 602. The electronic assembly 610 can include any circuit or combination of circuits. In one embodiment, the electronic assembly 610 includes a processor 612 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in the electronic assembly 610 are a custom circuit, an application-specific integrated circuit (ASIC), or the like, such as, for example, one or more circuits (such as a communications circuit 614) for use in wireless devices like mobile telephones, pagers, personal data assistants, portable computers, two-way radios, and similar electronic systems. The IC can perform any other type of function.

The electronic device 600 can also include an external memory 620, which in turn can include one or more memory elements suitable to the particular application, such as a main memory 622 in the form of random access memory (RAM), one or more hard drives 624, and/or one or more drives that handle removable media 626 such as compact disks (CD), digital video disk (DVD), and the like.

The electronic device 600 can also include a display device 616, one or more speakers 618, and a keyboard and/or controller 630, which can include a mouse, trackball, touch screen, voice-recognition device, or any other device that permits a system user to input information into and receive information from the electronic device 600.

ADDITIONAL EXAMPLES

Example 1 can include subject matter (such as an apparatus, a method, a means for performing acts) that can include a wafer that can comprise a plurality of semiconductor chips having a major surface, a metal contact positioned on one of the plurality of semiconductor chips and having a side surface and contact surface, the contact surface substantially parallel to the major surface, wherein the contact surface defines a thickness of the metal contact relative to the major surface, an underfill layer abutting the one of the plurality of semiconductor chips and the side surface of the metal contact, the underfill layer having a top surface substantially parallel to the major surface, wherein the top surface of the underfill layer defines a thickness of the underfill layer relative to the major surface, the thickness of the underfill layer being not greater than the thickness of the metal contact, and a solder bump formed in electrical contact with the contact surface of the metal contact.

In Example 2, a wafer of Example 1 optionally further comprises a photoresist layer abutting the top surface of the underfill layer and forming a cavity, wherein the solder bump is formed at least in part within the cavity.

In Example 3, the wafer of any one or more of Examples 1 and 2 optionally has a thickness of the underfill layer approximately equal to the thickness of the metal contact.

In Example 4, the wafer of any one or more of Examples 1-3 optionally has the metal contact comprised of copper.

In Example 5, a method of making an electrical interconnect comprises forming a metal contact on a substrate, the metal contact and having a side surface and contact surface, the contact surface substantially parallel to the substrate, applying an underfill layer to the substrate and the side surface of the metal contact, applying a photoresist layer to the top surface of the underfill layer, forming an opening to the metal contact through the photoresist layer, and filling solder at least in part within the opening and in electrical contact with the contact surface of the metal contact.

In Example 6 the method of Example 5 optionally further comprising planarizing the underfill layer so that the underfill layer has a top surface substantially parallel to the substrate and substantially flush with the contact surface of the metal contact.

In Example 7, the method of any one or more of Examples 5 and 6 optionally planarize the underfill prior to applying the photoresist layer.

In Example 8, the method of any one or more of Examples 5-7 optionally further comprises removing the photoresist layer.

In Example 9, the method of any one or more of Examples 5-8 optionally includes the substrate as a chip.

In Example 10, the method of any one or more of Examples 5-9 optionally includes the chip on a wafer.

In Example 11, the method of any one or more of Examples 5-10 optionally includes the contact surface of the metal contact defining a thickness of the metal contact relative to the substrate, the top surface of the underfill layer optionally defines a thickness of the underfill layer relative to the substrate, and applying the underfill layer optionally creates the thickness of the underfill layer not greater than the thickness of the metal contact.

In Example 12, the method of any one or more of Examples 5-11 optionally defines the contact surface of the metal contact as a thickness of the metal contact relative to the substrate, the top surface of the underfill layer optionally defines a thickness of the underfill layer relative to the substrate, and applying the underfill layer optionally creates the thickness of the underfill layer greater than the thickness of the metal contact.

In Example 13, the method of any one or more of Examples 5-12 optionally further forms the opening in, and passes through at least a portion of the underfill layer.

In Example 14, the method of any one or more of Examples 5-13, the metal contact is optionally formed with copper.

In Example 15, the method of any one or more of Examples 5-14 optionally includes the electrical interconnect s one of a plurality of interconnects on the substrate, and the plurality of electrical interconnects optionally has a coplanarity of their respective metal contacts and solder of not greater than about five micrometers In Example 16, the method of any one or more of Examples 5-15 optionally further comprises curing the underfill layer after removing the photoresist layer.

In Example 17, a chip comprises a substrate and a plurality of electrical interconnects, each electrical interconnect comprising a first metal contact positioned on the substrate and having a side surface and contact surface, the contact surface substantially parallel to the substrate and defining a thickness of the first metal contact relative to the substrate, an underfill layer abutting the substrate and the side surface of the first metal contact, the underfill layer having a top surface substantially parallel to the substrate and defining a thickness of the underfill layer relative to the substrate, the thickness of the underfill layer being not greater than the thickness of the first metal contact, and a second metal contact in electrical contact with the contact surface of the first metal contact.

In Example 18, the chip of Example 17 optionally has a coplanarity of the plurality of electrical interconnects of the first metal contact and the second metal contact of not greater than about five micrometers.

In Example 19, the chip of any one or more of Examples 17 and 18, the first metal contact optionally comprises copper and the second metal contact optionally comprises solder.

Each of these non-limiting examples can stand on its own, or can be combined with one or more of the other examples in any permutation or combination.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A wafer, comprising
a plurality of semiconductor chips having a major surface;
a plurality of metal contacts positioned directly on one of the plurality of semiconductor chips and having a side surface and contact surface, the contact surfaces of each of the metal contacts substantially parallel to the major surface, wherein each of the contact surfaces defines a thickness of the metal contact relative to the major surface, and wherein the thickness of a first metal contact of the plurality of metal contacts is different from the thickness of a second metal contact of the plurality of metal contacts;
an underfill layer directly abutting the one of the plurality of semiconductor chips and the side surface of the metal contact, the underfill layer having a top surface substantially parallel to the major surface, wherein the top surface of the underfill layer defines a thickness of the underfill layer relative to the major surface, the thickness of the underfill layer being not greater than the thickness of the metal contact;
a solder bump formed in electrical contact with the contact surface of the metal contact, the solder bump having substantially vertical sidewalls, and wherein a width of the solder bump is smaller than a width of the contact surface.

2. The wafer of claim 1, further comprising a photoresist layer abutting the top surface of the underfill layer and forming a cavity, wherein the solder bump is formed at least in part within the cavity.

3. The wafer of claim 1, wherein the thickness of the underfill layer is approximately equal to the thickness of the metal contact.

4. The wafer of claim 1, wherein the metal contact is comprised of copper.

5. The wafer of claim 1, wherein the underfill layer includes a material that includes an Alpha-1 coefficient of thermal expansion of less than $30*10^{(-6)}$ per degree Celsius below a glass transition temperature of the underfill layer.

6. The wafer of claim 1, wherein the underfill layer includes a material that includes an Alpha-2 coefficient of thermal expansion of less than $120*10^{(-6)}$ per degree Celsius above a glass transition temperature.

7. A chip, comprising:
a substrate; and
a plurality of electrical interconnects, each electrical interconnect comprising:

a first metal contact positioned directly on the substrate and having a side surface and contact surface, the contact surface substantially parallel to the substrate and defining a thickness of the first metal contact relative to the substrate;

an underfill layer directly abutting the substrate and the side surface of the first metal contact, the underfill layer having a top surface substantially parallel to the substrate and defining a thickness of the underfill layer relative to the substrate, the thickness of the underfill layer being not greater than the thickness of the first metal contact;

a second metal contact in electrical contact with the contact surface of the first metal contact the second metal contact having substantially vertical sidewalls, and wherein a width of the second metal contact is smaller than a width of the contact surface; and a third metal contact positioned directly on the substrate and having a side surface and contact surface, the contact surface substantially parallel to the substrate and defining a thickness of the third metal contact relative to the substrate, wherein the thickness of the first metal contact is different from the thickness of the third metal contact.

8. The chip of claim 7, wherein the plurality of electrical interconnects has a co-planarity between the first metal contact and the second metal contact of not greater than about five micrometers.

9. The chip of claim 7, wherein the first metal contact comprises copper and the second metal contact comprises solder.

10. The chip of claim 7, wherein the underfill layer includes a material that includes an Alpha-1 coefficient of thermal expansion of less than $30*10^{-6}$ per degree Celsius below a glass transition temperature of the underfill layer.

11. The chip of claim 7, wherein the underfill layer includes a material that includes an Alpha-2 coefficient of thermal expansion of less than $120*10^{-6}$ per degree Celsius above a glass transition temperature.

* * * * *